United States Patent [19]

Russell

[11] 4,392,256

[45] Jul. 5, 1983

[54] MECHANICAL REMOTE CONTROL DEVICE FOR A TELEVISION RECEIVER

[76] Inventor: Jerry E. Russell, 124 Via Baja, Ventura, Calif. 93003

[21] Appl. No.: 170,138

[22] Filed: Jul. 18, 1980

[51] Int. Cl.³ .......................... H04B 1/06; H04N 5/44
[52] U.S. Cl. .................................... 455/354; 455/355; 358/194.1; 74/10 A
[58] Field of Search ...................... 455/153, 354, 355; 74/10 A, 501; 358/194.1; 64/2 R, 2 P

[56] References Cited

U.S. PATENT DOCUMENTS

| | | | |
|---|---|---|---|
| 1,877,502 | 9/1932 | Flocco | 455/354 |
| 1,925,991 | 9/1933 | Shaw | 455/354 |
| 2,036,948 | 4/1936 | McNary | 74/10 A |
| 2,135,738 | 11/1938 | Todd | 455/355 |
| 2,853,897 | 9/1958 | Loewy | 74/10 A |
| 2,868,967 | 1/1959 | Poppa et al. | 455/354 |
| 2,957,353 | 10/1960 | Babacz | 64/2 P |
| 3,128,637 | 4/1964 | Richoux | 74/501 |
| 3,962,748 | 6/1976 | Michaels | 74/10 A |

*Primary Examiner*—Jin F. Ng
*Attorney, Agent, or Firm*—Jack C. Munro

[57] ABSTRACT

A mechanical remote control device for operating the volume control shaft of a television receiver which takes the form of a flexible cable which is attached to the volume control shaft and extends some distance outwardly away from the television receiver and terminates in a manually turnable knob. The cable is surrounded in a closely conforming manner by a cover. The cover is fixedly connected to a collar, which in turn is adhesively secured to the television receiver housing directly adjacent the volume control shaft. Rotation of the knob results in rotation of the cable and rotation of the shaft. The cable is to be movable lineally with respect to the cover which is to cause the volume control shaft to also move lineally between an off position and an on position.

2 Claims, 5 Drawing Figures

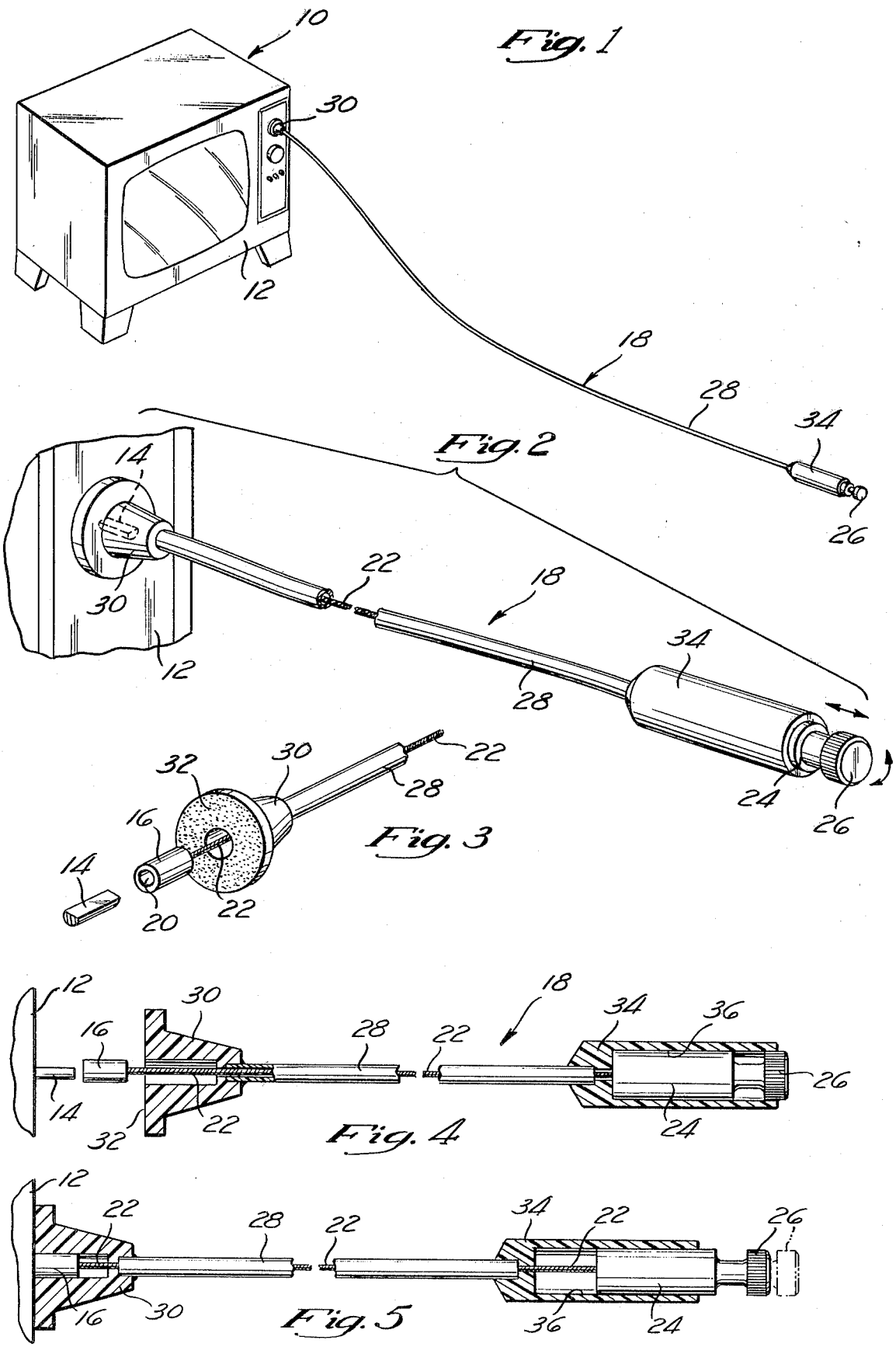

MECHANICAL REMOTE CONTROL DEVICE FOR A TELEVISION RECEIVER

BACKGROUND OF THE INVENTION

The present invention relates to a remote control apparatus and more particularly to a remote volume control and on/off operation for a television receiver.

The remote control of the volume, as well as the on/off switch of a television receiver, has heretofore been generally accomplished by the utilization of an electronically controlled remote switching device which is to energize an electrical signal receiving apparatus located within the television receiver. This type of remote control apparatus is obtained at the time of the purchase of the television receiver. These complex electronic devices are very expensive and are applicable to only a small portion of television receivers. Their widespread use and adoption by the viewing public has been severely limited.

At the present time, as much as thirty percent of the television time is in the form of commercial advertisements. To a great many people, these commercial advertisements are not particularly desirable. In fact, if the sound of the television receiver could be turned off during these commercial advertisements, watching of television would definitely be more pleasurable. Also, people can freely converse when the sound of the television is not on. As soon as it is apparent from the television screen that the commercial is over, the person can increase the sound of the television to the normal level.

Although there have been attempts in the past at designing television station selectors, there has been no known device which is specifically designed to control the activation of the television receiver and also to control the sound volume of the receiver.

SUMMARY OF THE INVENTION

The structure of this invention relates to a mechanical remote control device in the form of a twisted cable which is movably mounted within a housing in the form of a tube. The inner end of the cable is attached to a sleeve which is fixedly secured to the volume control shaft of a television receiver. The outer end of the cable is attached to a manually turnable knob. The inner end of the tube is fixedly attached to a collar which is to be fixedly secured by adhesive to the housing of the television receiver directly adjacent the volume control shaft. A knob housing is fixedly attached to the outer end of the tube and is adapted to support the manually turnable knob. The knob and the cable, as well as the attached sleeve, are to be lineally movable with respect to the tube so as to cause lineal movement of the volume control shaft between the on and the off position. By turning of the control knob, the cable is turned relative to the tube, which in turn causes rotation of the sleeve and the volume control shaft.

The primary objective of the present invention is to construct an inexpensive, mechanical remote control device which can be quickly and easily installed on existing television receivers.

BRIEF DESCRIPTION OF THE DRAWING

FIG. 1 is a perspective view of a television receiver to which has been secured the mechanical remote control of the present invention;

FIG. 2 is an enlarged view of the structure shown in FIG. 1 showing in more detail the mechanical remote control device of this invention;

FIG. 3 is a front end, isometric view of the mechanical remote control device of this invention showing its attachment arrangement to the television receiver;

FIG. 4 is a side, partly in cross-section, elevational view of the remote control device of this invention showing such about ready to be installed onto the volume control shaft of the television receiver; and FIG. 5 is a view similar to FIG. 4 but showing the remote control device in the installed position.

DETAILED DESCRIPTION OF THE SHOWN EMBODIMENT

Referring particularly to the drawing, there is shown in FIG. 1 a conventional television receiver 10 which is mounted within a box-like housing 12. The television receiver 12 includes a volume control shaft 14 which is deemed to be conventional and forms no specific part of this invention. The volume control shaft 14 is to be capable of being rotated to either increase or decrease the sound of the television receiver 10. Also, the control shaft 14 is to be movable lineally a short distance from an inner position to an outer position. When the volume control shaft 14 is in the inner position, the television receiver is switched off. When the volume control shaft 14 is in the outer position, the television receiver is then turned on.

The remote control device 18 of this invention includes, at its inner end, a short plastic sleeve 16. This sleeve 16 has an internal opening 20. The volume control shaft 14 is to be located within the internal opening 20 in a snug manner forming a tight connection between the sleeve 16 and the shaft 14.

The sleeve 16 is fixedly secured to a length of twisted cable 22. The cable 22 could be any desired length, but it is expected that, in most instances, the cable will be between twelve and fifteen feet long. The outer end of the cable 22 is fixedly secured to a tubular housing 24 of a manually operated control knob 26.

A plastic tube 28 is located substantially about the entire length of the cable 22. The cable 22 is capable of rotating with respect to the tube 28 and also a limited amount of lineal movement in respect thereto. The inner end of the tube 28 is fixedly secured to a collar 30. This collar 30 has an outer ring-shaped face 32 upon which is to be located a pressure sensitive adhesive. Prior to installation of the device 18 of this invention, the pressure sensitive adhesive will be protected by a lift-off protective cover.

The outer end of the tube 28 is fixedly secured to a sleeve 34. The sleeve 34 includes an internal chamber 36. The tubular housing 24 is to be slidably retained in a close fitting manner within the chamber 36.

The installation procedure and operation of the device 18 of this invention is as follows: Initially, the operator is to position the tubular housing 24 as far into the chamber 36 as possible as shown in FIG. 4 of the drawing. This causes the sleeve 16 to be extended outwardly away from the face 32 of the collar 30. The operator then removes whatever knob is attached onto the volume control shaft 14 and discards such. The operator then places the volume control shaft 14 within opening 20 of the sleeve 16, establishing a tight connection therebetween. The operator then removes the protective cover on the pressure adhesive on face 32 and discards this cover. The operator then physically moves the collar 30 with respect to the cable 22 until the pressure sensitive adhesive on the face 32 tightly engages with the housing 12 of the television receiver 10. This position is clearly shown within FIG. 5. In doing so, it is to be noted that the manually operated control knob 26 is caused to protrude outwardly from the sleeve 34. To turn on the television receiver 10, the operator only needs to grasp the manually operated control knob 26 and pull outwardly a short distance with respect to the sleeve 34, which will cause the volume control shaft 14 to also be moved outwardly, thereby turning on the receiver 10. To increase or decrease the volume of the television receiver 10, the operator only needs to manually turn the control knob 26, which in turn will cause simultaneous turning of the volume control knob 14. In order to turn the television receiver to the off position, the operator only needs to push inwardly on the knob 26 causing such to move a slight distance inwardly with respect to the sleeve 34. It is to be understood that when the device 18 of this invention is being used, that the control knob 26 will be located some distance away from the television receiver 10. When it is desired that the device 18 no longer be used, and the television receiver 10 is turned off, the device 18 will be coiled and placed on top of, or in close proximity to, the television receiver 10. It is also to be understood that normally the device 18 will remain attached to the receiver 10 at all times.

What is claimed is:

1. In combination with a television receiver, said television receiver having a rotatable volume control shaft, said volume control shaft being longitudinally movable between a retracted position and an extended position, with said volume control shaft in said retracted position said television receiver is inoperative, with said volume control shaft in said extended position said television receiver is operative, a mechanical remote control device for moving said volume control shaft, said device comprising:

a sleeve for snugly receiving said volume control shaft;

a twisted stranded cable secured to said sleeve, said twisted stranded cable extending a spaced distance from said television receiver terminating in a free end;

a manually graspable knob assembly attached to said twisted stranded cable at said free end; and encasing means covering said twisted stranded cable and a portion of said manually graspable knob assembly, said encasing means being secured against longitudinal movement in respect to said television receiver yet permitting lateral flexibility of said twisted stranded cable relative to said television receiver, said twisted stranded cable being rotatable within said encasing means and also being longitudinally movable relative to said encasing means during movement of said volume control shaft between said retracted position and said extended position, said encasing means comprises a cover located about said twisted stranded cable, said cover being connected to a second sleeve, said second sleeve having an internal chamber, a portion of said manually graspable knob assembly being located within said internal chamber and being longitudinally movable in respect thereto.

2. The combination as defined in claim 1 wherein:

said cover comprises a plastic tube closely conforming about said twisted stranded cable.

* * * * *